(12) United States Patent
Mochizuki

(10) Patent No.: US 10,741,994 B2
(45) Date of Patent: Aug. 11, 2020

(54) LIGHT EMITTER

(71) Applicant: Seiko Epson Corporation, Tokyo (JP)

(72) Inventor: Masamitsu Mochizuki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/260,809

(22) Filed: Jan. 29, 2019

(65) Prior Publication Data
US 2019/0237933 A1 Aug. 1, 2019

(30) Foreign Application Priority Data
Jan. 30, 2018 (JP) ................................ 2018-013739

(51) Int. Cl.
| | | |
|---|---|---|
| *H01S 5/024* | (2006.01) |
| *H01L 33/64* | (2010.01) |
| *F21V 5/04* | (2006.01) |
| *F21V 7/00* | (2006.01) |
| *H01S 5/022* | (2006.01) |

(Continued)

(52) U.S. Cl.
CPC ............ *H01S 5/02415* (2013.01); *F21V 5/04* (2013.01); *F21V 7/0091* (2013.01); *H01L 33/486* (2013.01); *H01L 33/64* (2013.01); *H01L 33/645* (2013.01); *H01S 5/0224* (2013.01);

(Continued)

(58) Field of Classification Search
CPC ............... H01S 5/0224; H01S 5/02461; H01S 5/18–18397; H01S 5/02407–02415; H01S 5/0228–02296; H01S 5/02208–02216; H01S 5/18308; H01S 5/18344–18352; H01S 5/02415; H01S 5/02476–02492; H01L 33/486; H01L 33/64; H01L 33/20;

(Continued)

(56) References Cited

U.S. PATENT DOCUMENTS 5,038,356 A * 8/1991 Botez .................. H01S 5/18369
257/15
5,052,016 A * 9/1991 Mahbobzadeh ....... B82Y 20/00
372/50.11

(Continued)

FOREIGN PATENT DOCUMENTS

EP 3557706 A1 * 10/2019 ......... H04B 10/2914
FR 2868877 A1 * 10/2005 ............. H01S 5/024

(Continued)

*Primary Examiner* — Joshua King
(74) *Attorney, Agent, or Firm* — Harness, Dickey & Pierce, P.L.C.

(57) ABSTRACT

A light emitter includes a substrate, a first mirror layer provided on the substrate, a columnar section including an active layer provided on a side of the first mirror layer that is the side opposite the substrate and a second mirror layer provided on a side of the active layer that is the side opposite the first mirror layer, a semi-insulating member provided on the side surface of the columnar section and having thermal conductivity higher than the thermal conductivity of the first mirror layer and the thermal conductivity of the second mirror layer, and a sub-mount which has a first surface bonded to the semi-insulating member and through which light produced in the active layer passes, and a second surface of the sub-mount that is the surface opposite the first surface is oriented in the direction in which the light produced in the active layer exits.

7 Claims, 10 Drawing Sheets

(51) Int. Cl.
*H01S 5/183* (2006.01)
*H01L 33/48* (2010.01)
*H01L 33/20* (2010.01)

(52) U.S. Cl.
CPC ...... *H01S 5/02438* (2013.01); *H01S 5/18347* (2013.01); *H01S 5/18352* (2013.01); *H01L 33/20* (2013.01)

(58) Field of Classification Search
CPC .................. H01L 2224/13186–13191; H01L 2224/136–13684
See application file for complete search history.

(56) References Cited

U.S. PATENT DOCUMENTS

| | | | | |
|---|---|---|---|---|
| 5,117,469 | A * | 5/1992 | Cheung | B82Y 20/00 257/18 |
| 5,434,939 | A * | 7/1995 | Matsuda | G02B 6/4202 257/116 |
| 5,436,920 | A * | 7/1995 | Minemoto | H01S 3/109 372/21 |
| 5,513,021 | A * | 4/1996 | Kaneshiro | G02B 6/4232 359/15 |
| 5,661,076 | A * | 8/1997 | Yoo | H01S 5/18347 438/39 |
| 6,184,066 | B1 * | 2/2001 | Chino | H01L 21/563 438/118 |
| 6,339,496 | B1 * | 1/2002 | Koley | H01S 5/50 359/344 |
| 6,469,785 | B1 * | 10/2002 | Duveneck | G01N 21/648 356/244 |
| 6,597,713 | B2 * | 7/2003 | Ouchi | H01S 5/423 372/36 |
| 2002/0114369 | A1 * | 8/2002 | Kinoshita | H01S 5/18333 372/46.01 |
| 2002/0127754 | A1 * | 9/2002 | Kaneko | B82Y 20/00 438/29 |
| 2002/0176468 | A1 * | 11/2002 | Kaneko | H01S 5/0264 372/50.23 |
| 2002/0176475 | A1 * | 11/2002 | Sai | H01L 33/46 372/96 |
| 2003/0006416 | A1 * | 1/2003 | Dudoff | G02B 6/4204 257/79 |
| 2003/0013217 | A1 * | 1/2003 | Dudoff | G02B 6/4204 438/27 |
| 2003/0013225 | A1 * | 1/2003 | Dudoff | G02B 6/4204 438/59 |
| 2003/0013230 | A1 * | 1/2003 | Dudoff | G02B 6/4204 438/107 |
| 2003/0081638 | A1 * | 5/2003 | Hamster | G02B 6/4204 372/23 |
| 2004/0264530 | A1 * | 12/2004 | Ryou | H01S 5/18308 372/44.01 |
| 2005/0014349 | A1 * | 1/2005 | Carey | H01S 5/323 438/478 |
| 2005/0094695 | A1 * | 5/2005 | Trezza | H01S 5/0264 372/50.1 |
| 2005/0163182 | A1 * | 7/2005 | Kaneko | B82Y 20/00 372/50.1 |
| 2005/0236104 | A1 * | 10/2005 | Tanaka | H01L 24/13 156/308.2 |
| 2008/0224331 | A1 * | 9/2008 | Neishi | H01L 24/05 257/785 |
| 2010/0187449 | A1 * | 7/2010 | Schemmann | G06F 3/0317 250/552 |
| 2011/0044369 | A1 * | 2/2011 | Andry | G02B 6/4204 372/50.124 |
| 2012/0049079 | A1 * | 3/2012 | Yanoff | G01T 1/244 250/370.13 |
| 2012/0235117 | A1 * | 9/2012 | Fukui | H01L 21/02488 257/13 |
| 2013/0272330 | A1 * | 10/2013 | Joseph | H01S 5/02476 372/36 |
| 2014/0064315 | A1 * | 3/2014 | Dummer | H01S 5/0261 372/50.124 |
| 2016/0163747 | A1 | 6/2016 | Koide | |
| 2016/0276300 | A1 * | 9/2016 | Matsuo | H01L 24/32 |

FOREIGN PATENT DOCUMENTS

| | | | | |
|---|---|---|---|---|
| FR | 2884047 A1 * | 10/2006 | ............ | H01L 23/10 |
| JP | 2016-111211 A | 6/2016 | | |
| WO | WO-02084826 A1 * | 10/2002 | ......... | H01S 5/18366 |

* cited by examiner

LIGHT EMITTER

BACKGROUND

1. Technical Field

The present invention relates to a light emitter.

2. Related Art

In recent years, a wearable terminal worn by a human body, such as a wristband activity monitor or a smartwatch, has been widely used. For example, JP-A-2016-111211 describes a biological sensing apparatus including a light emitter that irradiates a human body with light and an image sensor that receives part of light scattered in the human body in the form of reflected light and acquiring biological information, such as a specific component in the blood.

A light emitting device, such as a vertical cavity surface emitting laser (VCSEL) used as a light emitting device, is mounted on a mounting substrate. The light emitting device is formed by crystal growth of a first mirror layer, an active layer, and a second mirror layer on a semiconductor substrate. In general, in the case where the light emitting device is mounted on the mounting substrate, the substrate-side surface of the light emitting device is mounted on the mounting substrate, and light is outputted via the surface facing a side of the light emitting device that is the side opposite the substrate. On the other hand, heat generated by the light emitting device is dissipated via the surface thereof facing the mounted substrate. Therefore, to place priority to heat dissipation performance, a side of the light emitting device that is the side opposite the substrate is mounted on the mounted substrate (junction-down mounting), and the light is outputted via the substrate-side surface of the light emitting device.

In the biological sensing apparatus described in JP-A-2016-111211, however, the sensor or other parts are not provided on the side toward which the light emitter emits the light, that is, on the outer side of a product, but the sensor and other parts provided inside the product. Therefore, in the biological sensing apparatus described in JP-A-2016-111211, the heat is dissipated toward the interior of the product, where the sensor and other parts are present, resulting in poor cooling efficiency.

SUMMARY

An advantage of some aspects of the invention is to provide a light emitter that performs efficient cooling.

A light emitter according to an aspect of the invention includes a substrate, a first mirror layer provided on the substrate, a columnar section including an active layer provided on a side of the first mirror layer that is a side opposite the substrate and a second mirror layer provided on a side of the active layer that is a side opposite the first mirror layer, a semi-insulating member provided on a side surface of the columnar section and having thermal conductivity higher than thermal conductivity of the first mirror layer and thermal conductivity of the second mirror layer, and a sub-mount which has a first surface bonded to the semi-insulating member and through which light produced in the active layer passes, and a second surface of the sub-mount that is a surface opposite the first surface is oriented in a direction in which the light produced in the active layer exits.

In the thus configured light emitter, the heat generated in the active layer is likely to be conducted through the semi-insulating member and the sub-mount and dissipated via the second surface. The light emitter therefore allows the heat to be dissipated in the direction in which the light exits, whereby the heat can be dissipated toward the exterior of a product containing, for example, the light emitter. The light emitter therefore performs efficient cooling.

The light emitter according to the aspect of the invention may further include a Peltier device or a heat sink provided on the second surface.

The thus configured light emitter allows the second surface to be cooled.

In the light emitter according to the aspect of the invention, the sub-mount may be made of silicon, and the light produced in the active layer may have a wavelength of 940 nm or longer.

In the thus configured light emitter, the light produced in the active layer is unlikely to be absorbed by the sub-mount provided with no opening and is allowed to pass through the sub-mount. Therefore, in the thus configured light emitter, the sub-mount may be provided with no opening and can therefore be readily formed.

In the light emitter according to the aspect of the invention, the sub-mount may be provided with an opening through which the light produced in the active layer passes.

In the thus configured light emitter, the opening allows the light produced in the active layer to pass through the sub-mount.

In the light emitter according to the aspect of the invention, the opening may have an area that increases with distance from the first surface toward the second surface.

In the thus configured light emitter, the surface area of the sub-mount can be increased with no loss of the light produced in the active layer, as compared with a case where the opening has a rectangular cross-section, whereby the heat dissipation capability of the sub-mount can be increased.

In the light emitter according to the aspect of the invention, the semi-insulating member may be made of GaAs (gallium arsenide).

In the thus configured light emitter, the thermal conductivity of the semi-insulating member can be increased, as compared, for example, with a case where the semi-insulating member is made of AlGaAs, AlInP, GaInP, or AlGaInP.

The light emitter according to the aspect of the invention may further include a circuit substrate that is provided on a side of the semiconductor substrate that is a side opposite the first mirror layer and drives a light emitting device including the first mirror layer, the active layer, and the second mirror layer.

In the thus configured light emitter, since the heat generated in the active layer can be dissipated via the second surface, the heat generated in the active layer is unlikely to be conducted to the circuit substrate. Therefore, in the thus configured light emitter, the reliability of the circuit substrate can be increased.

In the light emitter according to the aspect of the invention, the sub-mount may be bonded to the circuit substrate via a bonding member, and the bonding member may include a protrusion made of a resin, and an electrically conductive layer that covers the protrusion.

In the thus configured light emitter, the height of the light emitting device and the height of the sub-mount can be more flexibly set.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described below in detail with reference to the drawings. It is not intended that the embodiment described below unduly limits the contents of the invention set forth in the appended claims. Further, all configurations described below are not necessarily essential configuration requirements of the invention.

1. Light Emitter

Figure 1:
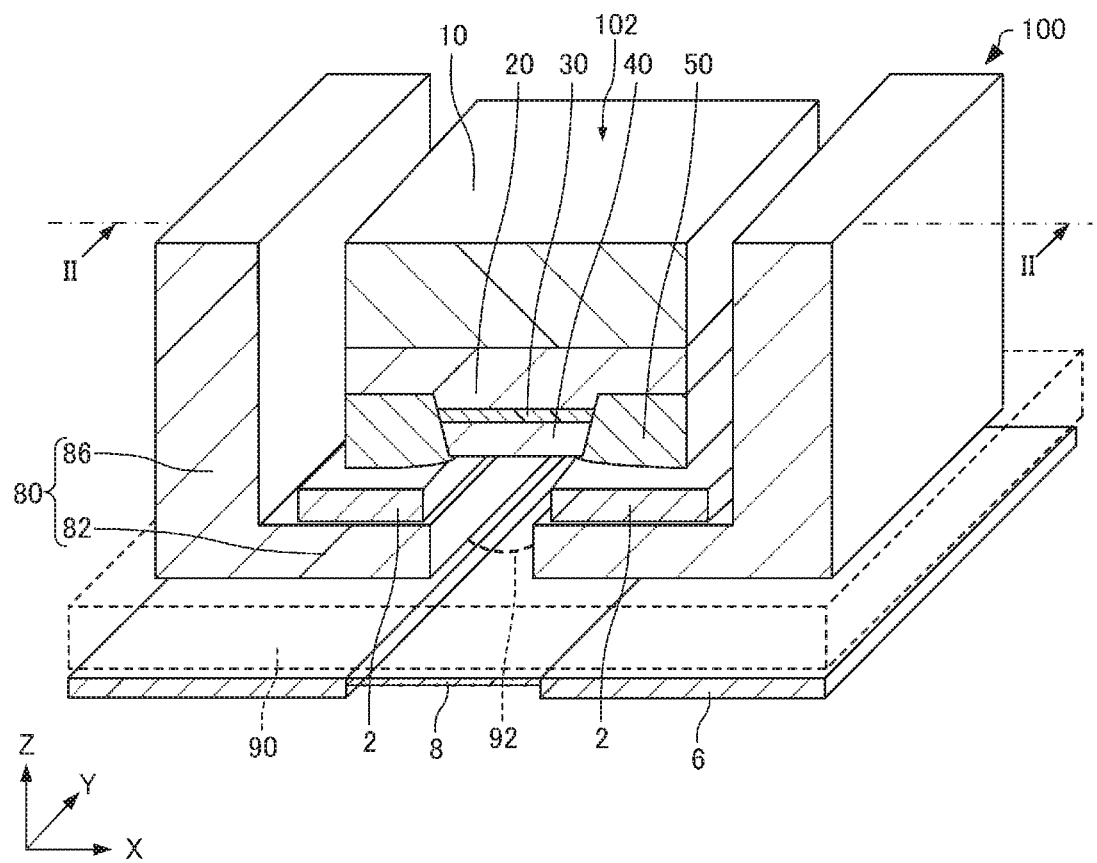
FIG. 1 is a perspective view diagrammatically showing a light emitter according to an embodiment of the invention.
Figure 2:
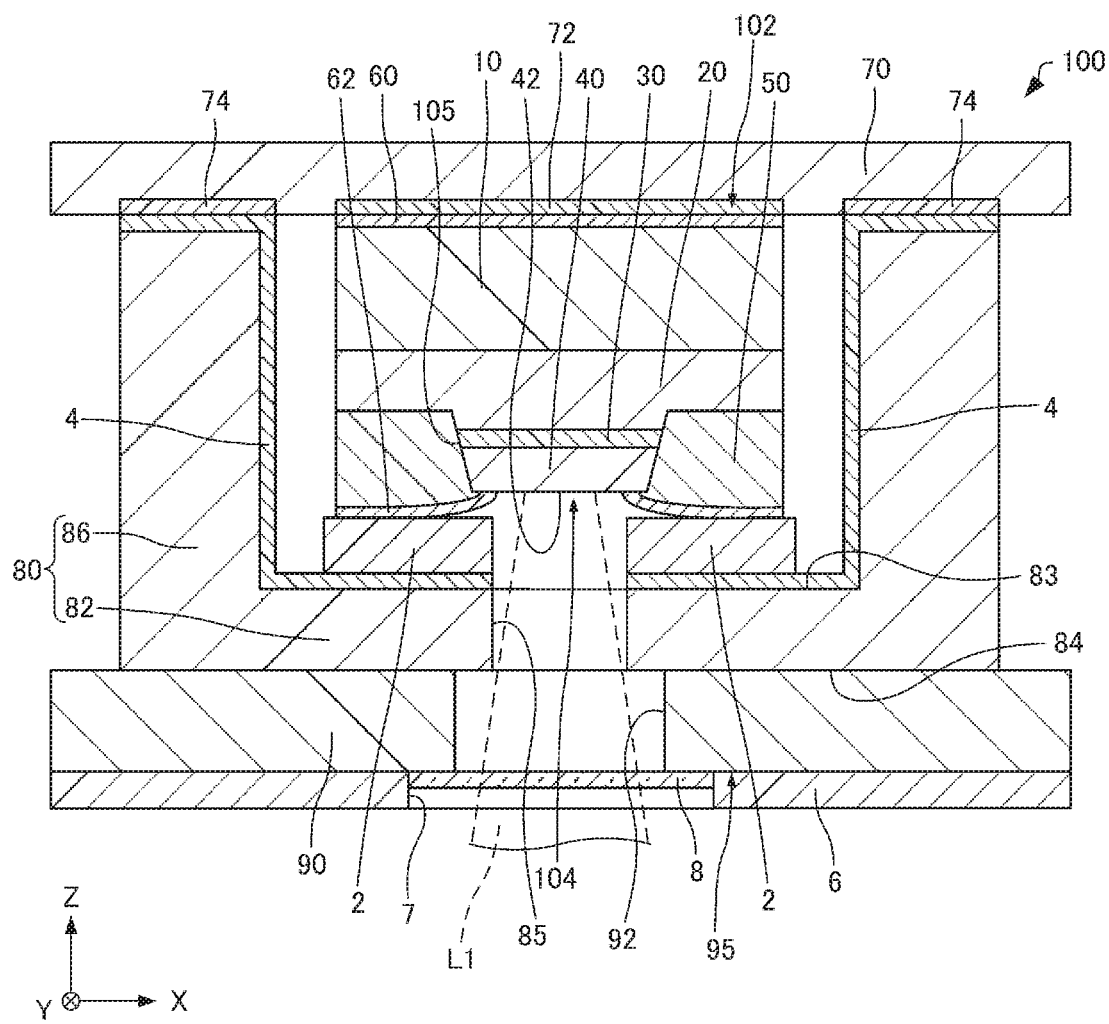
FIG. 2 is a cross-sectional view diagrammatically showing the light emitter according to the embodiment.

A light emitter according to the present embodiment will first be described with reference to the drawings. FIG. 1 is a cross-sectional perspective view diagrammatically showing a light emitter 100 according to the present embodiment. FIG. 2 is a cross-sectional view diagrammatically showing the light emitter 100 according to the present embodiment and taken along the line II-II in FIG. 1. In FIG. 1, wiring 4, electrodes 60 and 62, and a circuit substrate 70 are omitted for convenience. Further, in FIG. 1, a cooler 90 is drawn in a see-through manner. FIGS. 1 and 2 further show axes X, Y, and Z as three axes perpendicular to one another.

The light emitter 100 includes a light emitting device 102, a circuit substrate 70, a sub-mount 80, a cooler 90, and other parts, as shown in FIGS. 1 and 2.

The light emitting device 102 includes a substrate 10, a first mirror layer 20, an active layer 30, a second mirror layer 40, a semi-insulating member 50, a first electrode 60, a second electrode 62, and other parts. The light emitting device 102 is, for example, a VCSEL.

The substrate 10 is, for example, a first-conductivity-type (n-type, for example) GaAs substrate.

The first mirror layer 20 is provided on the substrate 10. In the illustrated example, the first mirror layer 20 is provided on the −Z-axis-direction side of the substrate 10. The first mirror layer 20 has a layered structure element in which a high-refractive-index layer and a low-refractive-index layer having a refractive index lower than that of the high-refractive-index layer are alternately layered on each other. The first mirror layer 20 is a distributed Bragg reflector (DBR) mirror. The high-refractive-index layer is, for example, an n-type $Al_{0.5}Ga_{0.5}As$ layer. The low-refractive-index layer is, for example, an n-type $Al_{0.9}Ga_{0.1}As$ layer. The number of layers of high-refractive-index and low-refractive-index (number of pairs) is, for example, greater than or equal to 40 but smaller than or equal to 80.

The active layer 30 is provided on a side of the first mirror layer 20 that is the side opposite the substrate 10. In the illustrated example, the active layer 30 is provided on the −Z-axis-direction side of the first mirror layer 20. The active layer 30 is provided between the first mirror layer 20 and the second mirror layer 40. The active layer 30 has, for example, a multiple quantum well (MQW) structure in which three quantum well structures each formed of an i-type GaInP layer (well layer) and an i-type AlGaInP layer (barrier layer) are layered on each other.

The active layer 30 emits light when current is injected thereinto. The light produced in the active layer 30 is, for example, red light (light having a wavelength longer than or equal to 660 nm but shorter than or equal to 700 nm, for example).

The second mirror layer 40 is provided on a side of the active layer 30 that is the side opposite the first mirror layer 20. In the illustrated example, the second mirror layer 40 is provided on the −Z-axis-direction side of the active layer 30. The second mirror layer 40 has a layered structure element in which a high-refractive-index layer and a low-refractive-index layer having a refractive index lower than that of the high-refractive-index layer are alternately layered on each other. The second mirror layer 40 is a distributed Bragg reflector (DBR) mirror. The high-refractive-index layer is, for example, a second-conductivity-type (p-type, for example) $Al_{0.5}Ga_{0.5}As$ layer. The low-refractive-index layer is, for example, a p-type $Al_{0.9}Ga_{0.1}As$ layer. The number of layers of high-refractive-index and low-refractive-index (number of pairs) is, for example, greater than or equal to 30 but smaller than or equal to 50.

The second mirror layer 40, the active layer 30, and part of the first mirror layer 20 form a columnar section 104. That is, the columnar section 104 includes the second mirror layer 40, the active layer 30, and part of the first mirror layer 20. In the illustrated example, a side surface 105 of the columnar section 104 inclines with respect to a surface of the substrate 10 that is the surface in contact with the first mirror layer 20.

The second mirror layer 40, the active layer 30, and the first mirror layer 20 form a vertical resonant cavity and a pin diode. When voltage in the forward direction of the pin diode is applied between the electrodes 60 and 62, electrons and holes are recombined with each other in the active layer 30, resulting in light emission. The light produced in the active layer 30 travels back and forth between the first mirror layer 20 and the second mirror layer 40 (undergoes multiple reflection), resulting in stimulated emission and hence optical intensity amplification. Once the optical gain exceeds the optical loss, laser oscillation occurs, and light L1 exits via the surface facing the second mirror layer 40 in the −Z-axis direction. The light L1 produced in the active layer 30 exits in the −Z-axis direction. The second mirror layer 40 has, for example, a light exiting surface 42, via which the light L1 exits.

Although not shown, a current narrowing layer formed by oxidizing at least one of the layers that form the second mirror layer 40 may be provided. The current narrowing layer can prevent current injected by the electrodes 60 and 62 into the columnar section 104 from spreading in the in-plane direction (direction perpendicular to direction in which first mirror layer 20 and active layer 30 are layered on each other).

The semi-insulating member 50 is provided on the side surface 105 of the columnar section 104. The semi-insulating member 50 is provided around the columnar section 104 when viewed in the direction in which the first mirror layer 20 and the active layer 30 are layered on each other (hereinafter also simply referred to as "layered direction") (when viewed in Z-axis direction in illustrated example). In the illustrated example, the semi-insulating member 50 is provided on the first mirror layer 20. The semi-insulating member 50 may be lattice-matched with the columnar section 104 and the first mirror layer 20. The semi-insulating member 50 is, for example, in contact with the active layer 30 and the mirror layers 20 and 40.

The semi-insulating member 50 has thermal conductivity higher than the thermal conductivity of the first mirror layer 20 and the thermal conductivity of the second mirror layer 40. The mirror layers 20 and 40, into which impurities have been doped to ensure electric conductivity, each have a large number of interfaces of which compositions differ from each other. The thermal conductivity of the semi-insulating member 50 is therefore higher than the thermal conductivity of each of the mirror layers 20 and 40. The semi-insulating member 50 is a compound semiconductor member having a sheet resistance higher than or equal to 3000 (Ω/square). The sheet resistance R is expressed by R=ρ/t (Ω/square), where ρ represents the resistivity of a specimen, and t represents the thickness of the specimen. The sheet resistance can be measured, for example, with a commercially available contact-type or non-contact-type resistance measuring apparatus. The semi-insulating member 50 is, for example, an i-type compound semiconductor member. The thermal conductivity of the semi-insulating member 50, which is an i-type compound semiconductor member, can be higher, for example, than the thermal conductivity of polyimide and other resin materials. The semi-insulating member 50 is made, for example, of GaAs, AlGaAs ($Al_{0.9}Ga_{0.1}As$, for example), AlInP, GaInP, or AlGaInP, preferably GaAs or AlGaAs, more preferably GaAs. Hydrogen ions ($H^+$), for example, may be doped into the semi-insulating member 50 as long as the semi-insulating member 50 has thermal conductivity higher than that of each of the mirror layers 20 and 40.

The first electrode 60 is provided on the substrate 10. In the illustrated example, the first electrode 60 is provided on the +Z-axis-direction side of the substrate 10. The first electrode 60 is, for example, in ohmic contact with the substrate 10. The first electrode 60 is electrically connected to the first mirror layer 20 via the substrate 10. The first electrode 60 is formed, for example, by layering a Cr layer, an AuGe layer, an Ni layer, and an Au layer in the presented order from the side facing the substrate 10. The first electrode 60 is one of the electrodes for injecting current into the active layer 30.

The second electrode 62 is provided, for example, on the second mirror layer 40 and the semi-insulating member 50. In the illustrated example, the second electrode 62 is provided on the −Z-axis-direction side of the second mirror layer 40 and the semi-insulating member 50. For example, the second mirror layer 40 includes a contact layer, and the second electrode 62 is in ohmic contact with the contact layer. The contact layer is located nearest to the −Z-axis direction out of the layers that form the second mirror layer 40. The second electrode 62 is electrically connected to the second mirror layer 40. The second electrode 62 is formed, for example, by layering a Cr layer, a Pt layer, a Ti layer, a Pt layer, and an Au layer in the presented order from the side facing the second mirror layer 40. The second electrode 62 is the other one of the electrodes for injecting current into the active layer 30.

The circuit substrate 70 is provided on a side of the substrate 10 that is the side opposite the first mirror layer 20. In the illustrated example, the circuit substrate 70 is provided on the +Z-axis-direction side of the light emitting device 102. The light emitting device 102 is so mounted on the circuit substrate 70 that the first electrode of the light emitting device 102 faces the circuit substrate 70. The light emitting device 102 is bonded to the circuit substrate 70, for example, via solder.

The circuit substrate 70 includes, for example, a first pad 72 connected to the first electrode 60 and a second pad 74 connected to wiring 4. The pads 72 and 74 are made, for example, of a metal. The circuit substrate drives the light emitting device 102. The circuit substrate 70 includes, for example, an IC (integrated circuit) chip for driving the light emitting device 102.

The sub-mount 80 is boned to the semi-insulating member 50 via a bonding member 2. The bonding member 2 has electric conductivity. The bonding member 2 is, for example, solder (made, for example of AuSn). Solder paste may be applied onto the bonding member 2. The bonding member 2 may instead be silver paste (nano-silver paste containing nano-size silver particles, for example). The bonding member 2 is so provided as not to block the light L1.

In the illustrated example, the sub-mount 80 is provided to cover the −Z-axis-direction side of the light emitting device 102 except the light exiting surface 42. The sub-mount 80 is so shaped as to accommodate the light emitting device 102. The sub-mount 80 is made, for example, of silicon. The sub-mount 80 can therefore be formed by using a semiconductor process.

The sub-mount 80 is provided with the wiring 4. The wiring 4 connects the circuit substrate 70 to the bonding member 2. The wiring 4 is made, for example, of copper or aluminum. The circuit substrate 70 and the second electrode 62 are electrically connected to each other via the bonding member 2 and the wiring 4.

The sub-mount 80 has a bottom section 82, which is so disposed as to face the circuit substrate 70, and a side section 86, which is connected to the bottom sections 82. The bottom section 82 is bonded to the semi-insulating member 50. The bottom section 82 has a first surface 83 and a second surface 84, which faces opposite to the first surface 83. The second surface 84 is oriented in the direction in which the light L1 exits. In the illustrated example, the second surface 84 is oriented in the −Z-axis direction. The second surface 84 and the light exiting surface 42 are oriented in the same direction. The light exiting surface 42 and the second surface 84 are, for example, parallel to each other. The sub-mount 80, specifically the first surface 83 thereof is bonded to the semi-insulating member 50.

The bottom section 82 is provided with an opening 85, through which the light L1 passes. The light L1 can therefore pass through the sub-mount 80. The opening 85 passes through the bottom section 82 in the Z-axis direction. In the example shown in FIG. 2, the opening 85 has a rectangular cross-sectional shape (cross section in a plane parallel to the plane XZ). Further, when viewed in the Z-axis direction, the opening 85 has, for example, a rectangular shape. The side section 86 extends from the bottom section 82 in the +Z-axis direction. The side section 86 is connected to the circuit substrate 70 via the wiring 4.

The cooler 90 is provided on the second surface 84 of the sub-mount 80. In the illustrated example, the cooler 90 is provided on the −Z-axis-direction side of the sub-mount 80. The cooler 90 may be glued to the sub-mount 80, for example, via grease containing silver or silicon. The cooler 90 may further be glued to a support member 6, for example, via grease containing silver or silicon.

The cooler 90 can cool the second surface 84 by conducting the heat generated in the active layer 30 (heat generated by light emitting device 102) to the support member 6. The cooler 90 is, for example, a Peltier device or a heat sink. The cooler 90 is provided with an opening 92, through which the light L1 passes. The opening 92 passes through the cooler 90 in the Z-axis direction.

The cooler 90, the sub-mount 80, the wiring 4, and the bonding member 2 form a heat conductor 95, which conducts the heat generated in the active layer 30 to the support member 6. That is, a sensor section 1030 includes the heat conductor 95, and the heat conductor 95 includes the cooler 90. The heat conductor 95 connects a side of the light emitting device 102 that is the side facing the second mirror layer 40 to the support member 6. In the illustrated example, the heat conductor 95 connects the semi-insulating member 50 to the support member 6.

The light emitter 100 is supported by the support member 6. The support member 6 is made, for example, of a metal. The support member 6 is provided with an opening 7. In the illustrated example, the opening 7 passes through the support member 6 in the Z-axis direction. A light transmitting member 8, which transmits the light L1, is provided in the opening 7. The light transmitting member 8 is made, for example, of glass. An anti-reflection (AR) film that is not shown may be provided on each of the incident surface of light L1 and the exiting surface of light L1 of the light transmitting member 8.

The light emitter 100 has, for example, the following features.

The light emitter 100 includes the semi-insulating member 50, which is provided on the side surface 105 of the columnar section 104 and has thermal conductivity higher than the thermal conductivity of the mirror layers 20 and 40, and the sub-mount 80, the first surface 83 of which is bonded to the semi-insulating member 50 and through which the light L1 produced in the active layer 30 passes, and the second surface 84 of which is oriented in the direction in which the light L1 exits. Therefore, in the light emitter 100, the heat generated in the active layer 30 is likely to be conducted through the semi-insulating member 50, the bonding member 2, and the sub-mount 80 and dissipated via the second surface 84, as compared with a case where the thermal conductivity of the semi-insulating member 50 is lower than or equal to the thermal conductivity of the mirror layers 20 and 40. The light emitter 100 therefore allows the heat to be dissipated in the direction in which the light L1 exits, whereby the heat can be dissipated toward the exterior of a product containing, for example, the light emitter 100. The light emitter 100 can therefore perform efficient cooling and can be highly reliable. Further, for example, the life of the product can be improved. For example, in a case where the heat is dissipated toward the interior of a product containing, for example, the light emitter 100, the circuit substrate 70 and other parts may have lower cooling efficiency.

Further, in the light emitter 100, in which the semi-insulating member 50 is provided on the side surface 105 of the columnar section 104, stress induced in the columnar section 104 and the first mirror layer 20 (first mirror layer 20 provided on the +Z-axis-direction side of the semi-insulating member 50) can be reduced as compared, for example, with a case where a resin member is provided on the side surface 105. For example, the semi-insulating member 50 can be lattice-matched with the columnar section 104 and the first mirror layer 20, whereby the stress resulting from the semi-insulating member 50 and induced in the columnar section 104 and the first mirror layer 20 can be reduced.

The light emitter 100 includes the cooler 90 provided on the second surface 84. Therefore, in the light emitter 100, the second surface 84 can be cooled.

In the light emitter 100, the sub-mount 80 is provided with the opening 85, through which the light L1 passes. Therefore, in the light emitter 100, the light L1 can pass through the sub-mount 80.

In the light emitter 100, the semi-insulating member 50 is made of GaAs (gallium arsenide). Therefore, in the light emitter 100, the thermal conductivity of the semi-insulating member 50 can be increased, as compared, for example, with a case where the semi-insulating member 50 is made of AlGaAs, AlInP, GaInP, or AlGaInP.

The light emitter 100 includes the circuit substrate 70, which is provided on a side of the substrate 10 that is the side opposite the first mirror layer 20 and drives the light emitting device 102. In the light emitter 100, since the heat generated in the active layer 30 can be dissipated via the second surface 84, the heat generated in the active layer 30 is unlikely to be conducted to the circuit substrate 70. Therefore, in the light emitter 100, the reliability of the circuit substrate 70 can be increased.

The above description has been made of the case where the substrate 10 is an GaAs substrate. The substrate according to an aspect of the invention may instead, for example, be an InP substrate. In this case, the semi-insulating member according to an aspect of the invention is made, for example, of InP or InGaAsP, preferably InP.

The above description has been made of the case where the light emitting device 102 emits red light. The light emitting device 102 may instead emit infrared light (light having wavelength longer than or equal to 750 nm but shorter than or equal to 1.4 μm). In this case, the high-refractive-index layer in the first mirror layer 20 is, for example, an n-type $Al_{0.1}Ga_{0.9}As$ layer, and the low-refractive-index layer in the first mirror layer 20 is, for example, an n-type $Al_{0.9}Ga_{0.1}As$ layer, with the number of layers being greater than or equal to 25 pairs but smaller than or equal to 45 pairs. The active layer 30 has an MQW structure formed of an i-type GaAs layer (well layer) and an i-type $Al_{0.3}Ga_{0.7}As$ layer (barrier layer). The high-refractive-index layer in the second mirror layer 40 is, for example, an p-type $Al_{0.1}Ga_{0.9}As$ layer, and the low-refractive-index layer in the second mirror layer 40 is, for example, a p-type $Al_{0.9}Ga_{0.1}As$ layer, with the number of layers being greater than or equal to 15 pairs but smaller than or equal to 30 pairs.

2. Method for Manufacturing Light Emitter

A method for manufacturing the light emitter 100 according to the present embodiment will next be described with reference to the drawings. FIGS. 3 to 7 are cross-sectional views diagrammatically showing the steps of manufacturing the light emitter 100 according to the present embodiment.

Figure 3:
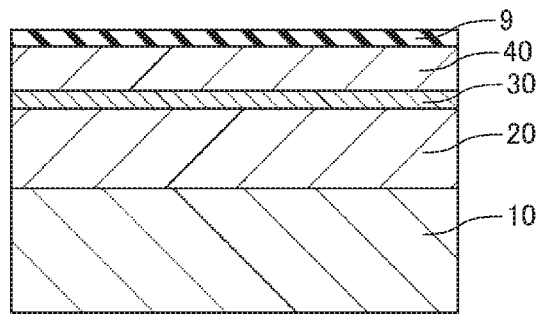
FIG. 3 is a cross-sectional view diagrammatically showing one of the steps of manufacturing the light emitter according to the embodiment.

The first mirror layer 20, the active layer 30, and the second mirror layer 40 are formed in the presented order on the substrate 10, as shown in FIG. 3. The first mirror layer 20, the active layer 30, and the second mirror layer 40 are each epitaxially grown, for example, by using a metal organic chemical vapor deposition (MOCVD) method or a molecular beam epitaxy (MBE) method.

A dielectric mask 9 is then formed on the second mirror layer 40. The dielectric mask 9 is formed, for example, by using a chemical vapor deposition (CVD) method or a sputtering method. The dielectric mask 9 is made, for example, of $SiO_2$, SiON, $TiO_2$, TiN, Ti, $Al_2O_3$, or $Ta_2O_5$.

Figure 4:
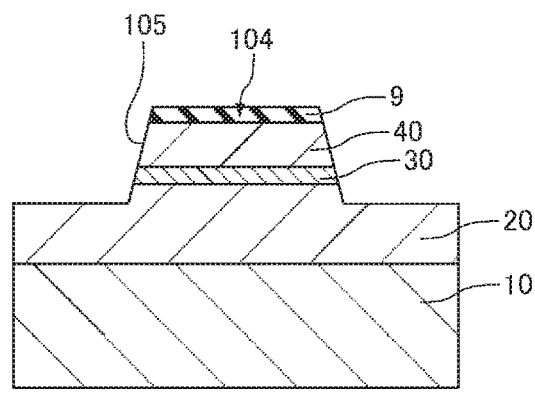
FIG. 4 is a cross-sectional view diagrammatically showing one of the steps of manufacturing the light emitter according to the embodiment.

The dielectric mask 9 is used as a mask to etch the second mirror layer 40, the active layer 30, and the first mirror layer 20, as shown in FIG. 4. The columnar section 104 can thus be formed.

Figure 5:
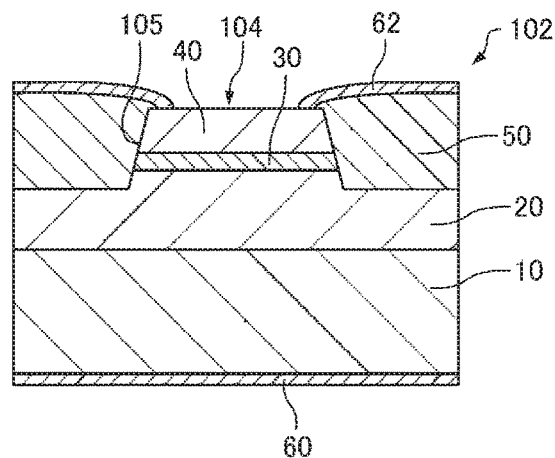
FIG. 5 is a cross-sectional view diagrammatically showing one of the steps of manufacturing the light emitter according to the embodiment.

The semi-insulating member 50 is formed on the side surface 105 of the columnar section 104, as shown in FIG. 5. The semi-insulating member 50 is epitaxially grown, for example, by using the MOCVD method or the MBE method. In this process, no epitaxial growth occurs in the region where the dielectric mask 9 is formed. The semi-insulating member 50 can therefore be epitaxially grown selectively from the side surface 105 of the columnar section 104 and the exposed upper surface of the first mirror layer 20. The dielectric mask 9 is then removed.

The second electrode 62 is then formed on the second mirror layer 40 and the semi-insulating member 50. The first electrode 60 is then formed below the substrate 10. The electrodes 60 and 62 are formed, for example, by using a vacuum evaporation method. The electrodes 60 and 62 are then alloyed, for example, by a heat treatment. The order in which the electrodes 60 and 62 are formed is not limited to a specific order.

The light emitting device 102 can be manufactured by carrying out the steps described above.

Figure 6:
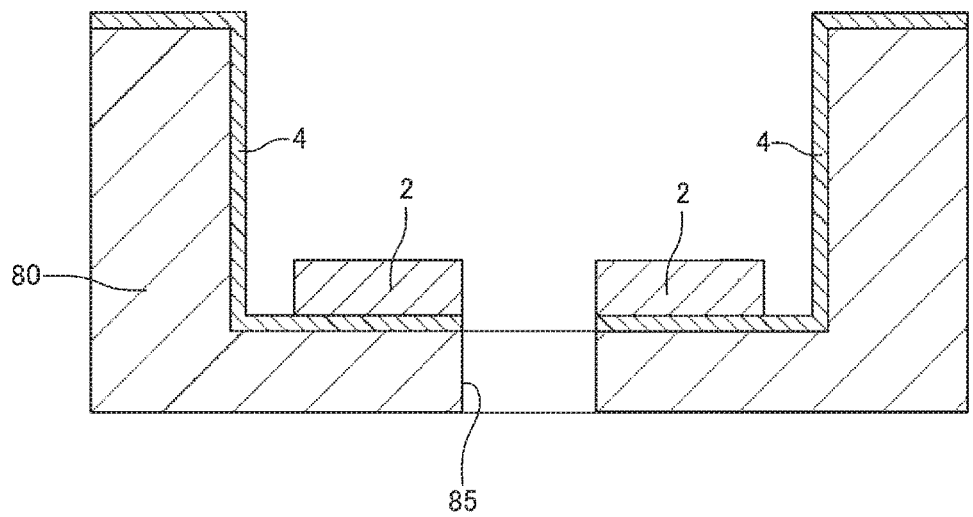
FIG. 6 is a cross-sectional view diagrammatically showing one of the steps of manufacturing the light emitter according to the embodiment.

For example, a silicon substrate is patterned to form the sub-mount 80, as shown in FIG. 6. The patterning is performed, for example, by using photolithography and etching.

The wiring 4 is then formed on the sub-mount 80. The wiring 4 is formed, for example, by using a sputtering method. The bonding member 2 is then formed on the wiring 4.

Figure 7:
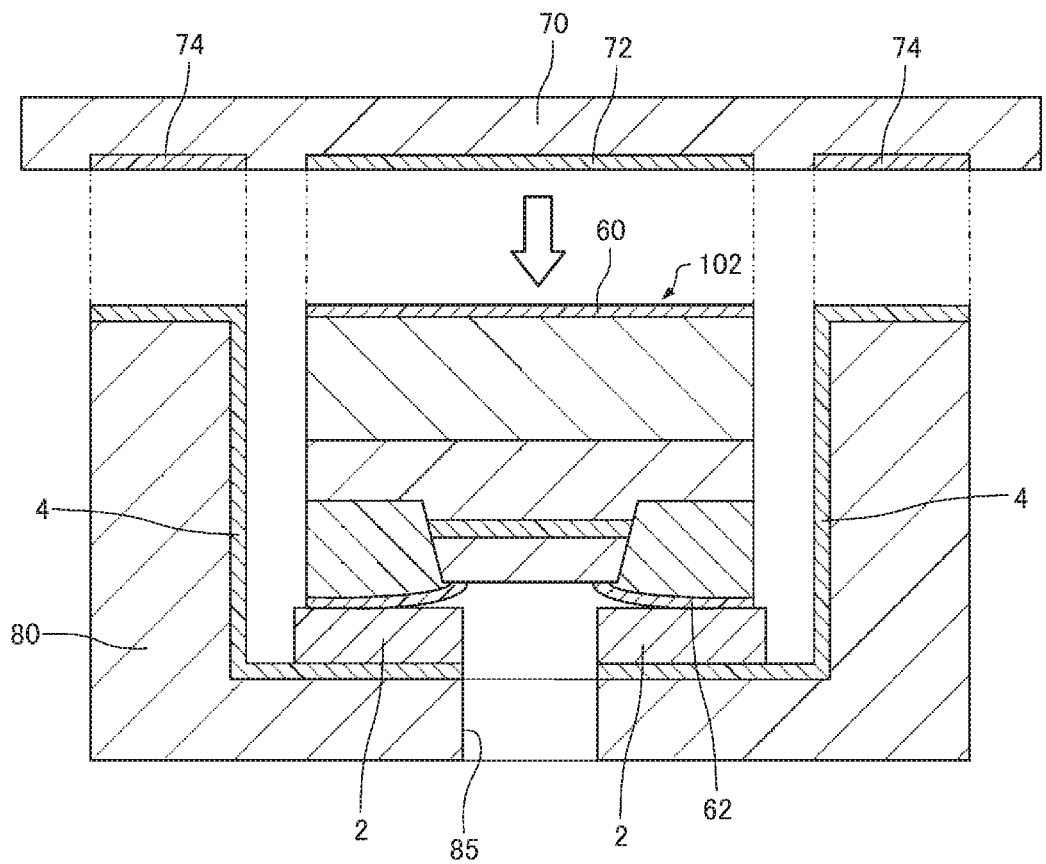
FIG. 7 is a cross-sectional view diagrammatically showing one of the steps of manufacturing the light emitter according to the embodiment.

The light emitting device 102 is so placed that the second electrode 62 is connected to the bonding member 2, as shown in FIG. 7. The bonding member 2 is then cured in a heat treatment. The light emitting device 102 can thus be bonded to the sub-mount 80.

The first electrode 60 is then bonded to the first pad 72 of the circuit substrate 70, for example, via solder. Further, the wiring 4 is bonded to the second pad 74 of the circuit substrate 70.

The light emitter 100 can be manufactured by carrying out the steps described above, as shown in FIG. 2.

3. Variations of Light Emitter

3.1. First Variation

Figure 8:
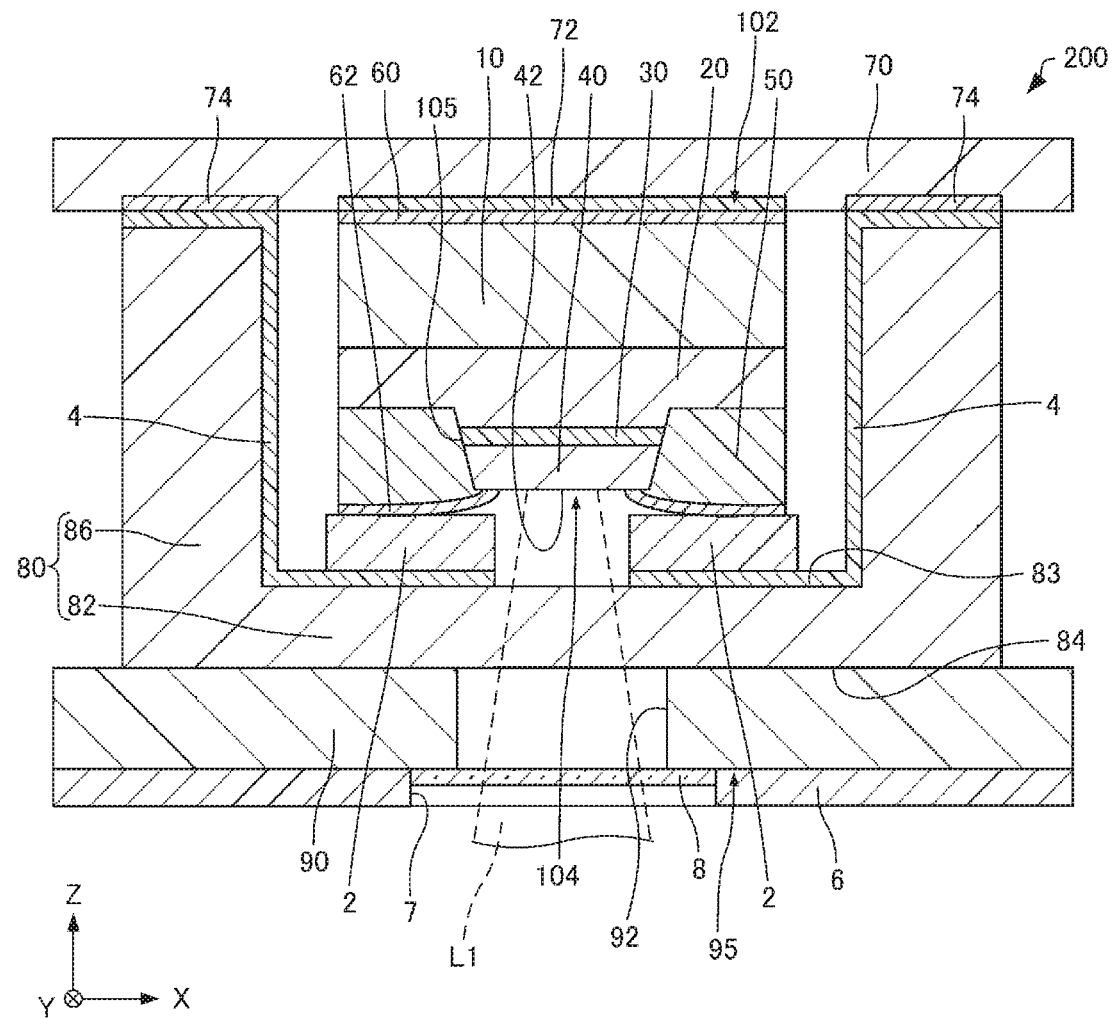
FIG. 8 is a cross-sectional view diagrammatically showing a light emitter according to a first variation of the embodiment.

A light emitter according to a first variation of the present embodiment will next be described with reference to the drawings. FIG. 8 is a cross-sectional view diagrammatically showing a light emitter 200 according to the first variation of the present embodiment. FIG. 8 and FIGS. 9 to 13, which will be described later, show axes X, Y, and Z as three axes perpendicular to one another.

The description of the light emitter 200 according to the first variation of the present embodiment will be made of points different from those of the light emitter 100 according to the present embodiment described above, and the same points will not be described. The same holds true for light emitters according to second, third, and fourth variations of the present embodiment, which will be described later.

In the light emitter 100 described above, the sub-mount 80 is provided with the opening 85, as shown in FIG. 2. In contrast, in the light emitter 200, as shown in FIG. 8 the sub-mount 80 is provided with no opening.

In the light emitter 200, the sub-mount 80 is made of silicon, and the light L1 produced in the active layer 30 has a wavelength longer than or equal to 940 nm. The light L1 is therefore unlikely to be absorbed by the sub-mount 80 provided with no opening and is allowed to pass through the sub-mount 80. Therefore, in the light emitter 200, the sub-mount 80 may be provided with no opening and can therefore be readily formed. An antireflection film (not shown) is preferably provided on each of the first surface 83 and the second surface 84.

3.2. Second Variation

Figure 9:
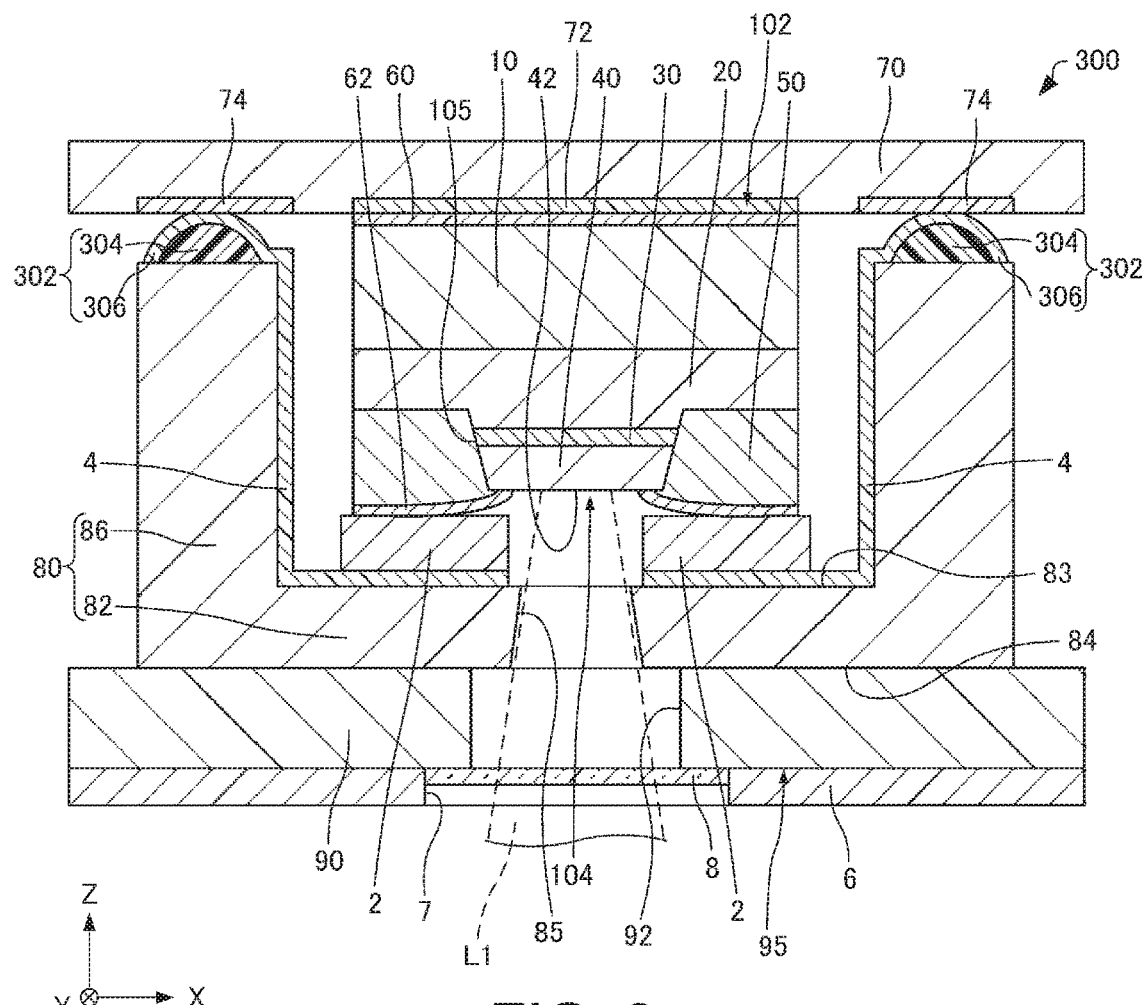
FIG. 9 is a cross-sectional view diagrammatically showing a light emitter according to a second variation of the embodiment.
Figure 10:
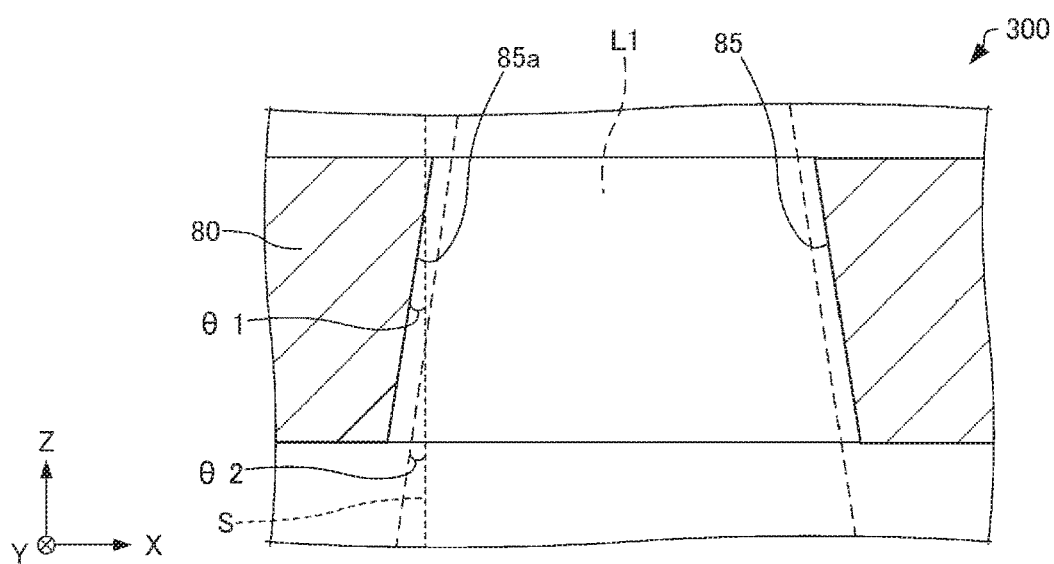
FIG. 10 is a cross-sectional view diagrammatically showing the light emitter according to the second variation of the embodiment.

A light emitter according to a second variation of the present embodiment will next be described with reference to the drawings. FIG. 9 is a cross-sectional view diagrammatically showing a light emitter 300 according to the second variation of the present embodiment. FIG. 10 is an enlarged view of the opening 85 and thereabound in FIG. 9. FIG. 10 shows no member but the sub-mount 80 for convenience.

In the light emitter 100 described above, the opening 85 has a rectangular cross-sectional shape, as shown in FIG. 2. In contrast, in the light emitter 300, the opening 85 has, for example, a trapezoidal cross-sectional shape, as shown in FIGS. 9 and 10.

In the light emitter 300, the area of the opening 85 (area in a plane parallel to the plane XY) increases with distance from the first surface 83 toward the second surface 84 of the sub-mount 80. The inclination angle (inclination angle with respect to a surface S parallel to the plane YZ in the illustrated example) θ1 of a side surface (sub-mount surface that defines opening 85) 85a of the opening 85 is greater than or equal to the inclination angle (inclination angle with respect to the surface S parallel to the plane YZ in the illustrated example) θ2 of the far field pattern (FFP) of the light L1. The inclination angles θ1 and θ2 are equal to each other in the illustrated example.

Further, the light emitter 300 differs from the light emitter 100 described above in that the sub-mount 80 is bonded to the circuit substrate 70 via a bonding member 302.

In the illustrated example, the bonding member 302 bonds the sub-mount 80 to the circuit substrate 70 via the wiring 4. The bonding member 302 includes a protrusion 304, which is made of a resin, and an electrically conductive layer 306, which covers the protrusion 304. The bonding member 302 is, for example, a resin core bump.

The protrusion 304 is provided on the side section 86 of the sub-mount 80. In the illustrated example, the protrusion 304 is provided on the +Z-axis-direction side of the side section 86. In the illustrated example, the protrusion 304 has a roughly semicircular cross-sectional shape. The electrically conductive layer 306 is integrated with the wiring 4.

In the light emitter 300, the area of the opening 85 increases with distance from the first surface 83 toward the second surface 84. Therefore, in the light emitter 300, the surface area of the sub-mount 80 can be increased with no loss of the light L1, as compared with the case where the opening 85 has a rectangular cross-section, whereby the heat dissipation capability of the sub-mount 80 can be increased.

In the light emitter 300, the sub-mount 80 is bonded to the circuit substrate 70 via the bonding member 302, and the bonding member 302 includes the protrusion 304, which is made of a resin, and the electrically conductive layer 306, which covers the protrusion 304. Therefore, in the light emitter 300, the bonding member 302 is deformed (shrunk in −Z-axis direction, for example), for example, when the circuit substrate 70 is bonded to the sub-mount 80, and the circuit substrate 70 can be bonded to the sub-mount 80. Therefore, in the light emitter 300, the height of the light emitting device 102 (position of the end of the light emitting device 102 in the +Z-axis direction in illustrated example) and the height of the sub-mount 80 can be more flexibly set.

3.3. Third Variation

Figure 11:
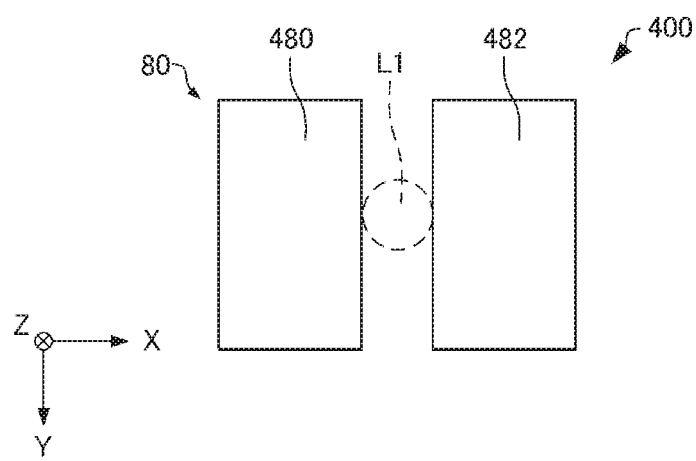
FIG. 11 is a plan view diagrammatically showing a light emitter according to a third variation of the embodiment.

A light emitter according to a third variation of the present embodiment will next be described with reference to the drawings. FIG. 11 is a plan view diagrammatically showing a light emitter 400 according to the third variation of the present embodiment. FIG. 11 shows no member but the sub-mount 80 for convenience.

In the light emitter 100 described above, the sub-mount 80 is made, for example, of silicon. In contrast, in the light emitter 400, the sub-mount 80 is not made of silicon but is made, for example, of AlN, $Al_2O_3$, or any other ceramic material or CuMo or any other metal.

In the light emitter 400, the sub-mount 80 includes a first plate-shaped member 480 and a second plate-shaped member 482, as shown in FIG. 11. The plate-shaped members 480 and 482 are separate from each other. The light L1 passes through the gap between the first plate-shaped member 480 and the second plate-shaped member 482.

Figure 12:
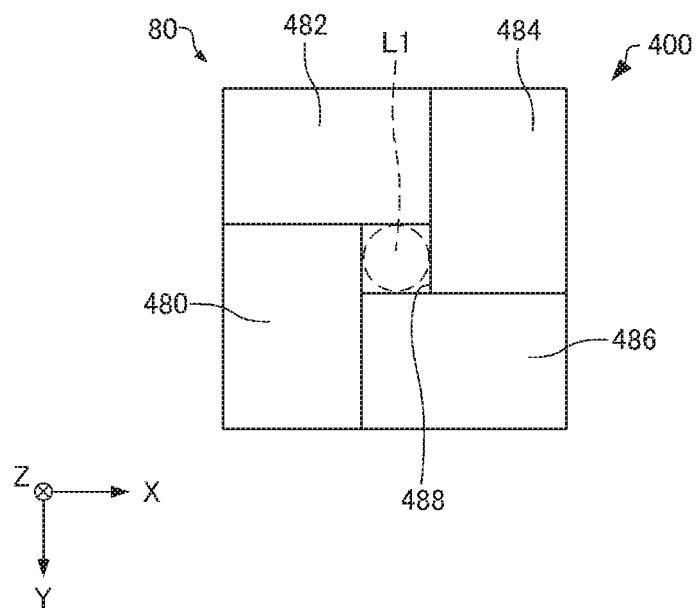
FIG. 12 is a plan view diagrammatically showing the light emitter according to the third variation of the embodiment.

In the light emitter 400, the sub-mount 80 may instead include the first plate-shaped member 480, the second plate-shaped member 482, a third plate-shaped member 484, and a fourth plate-shaped member 486, as shown in FIG. 12. The plate-shaped members 480, 482, 484, and 486 define an opening 488. The light L1 passes through the opening 488.

3.4. Fourth Variation

Figure 13:
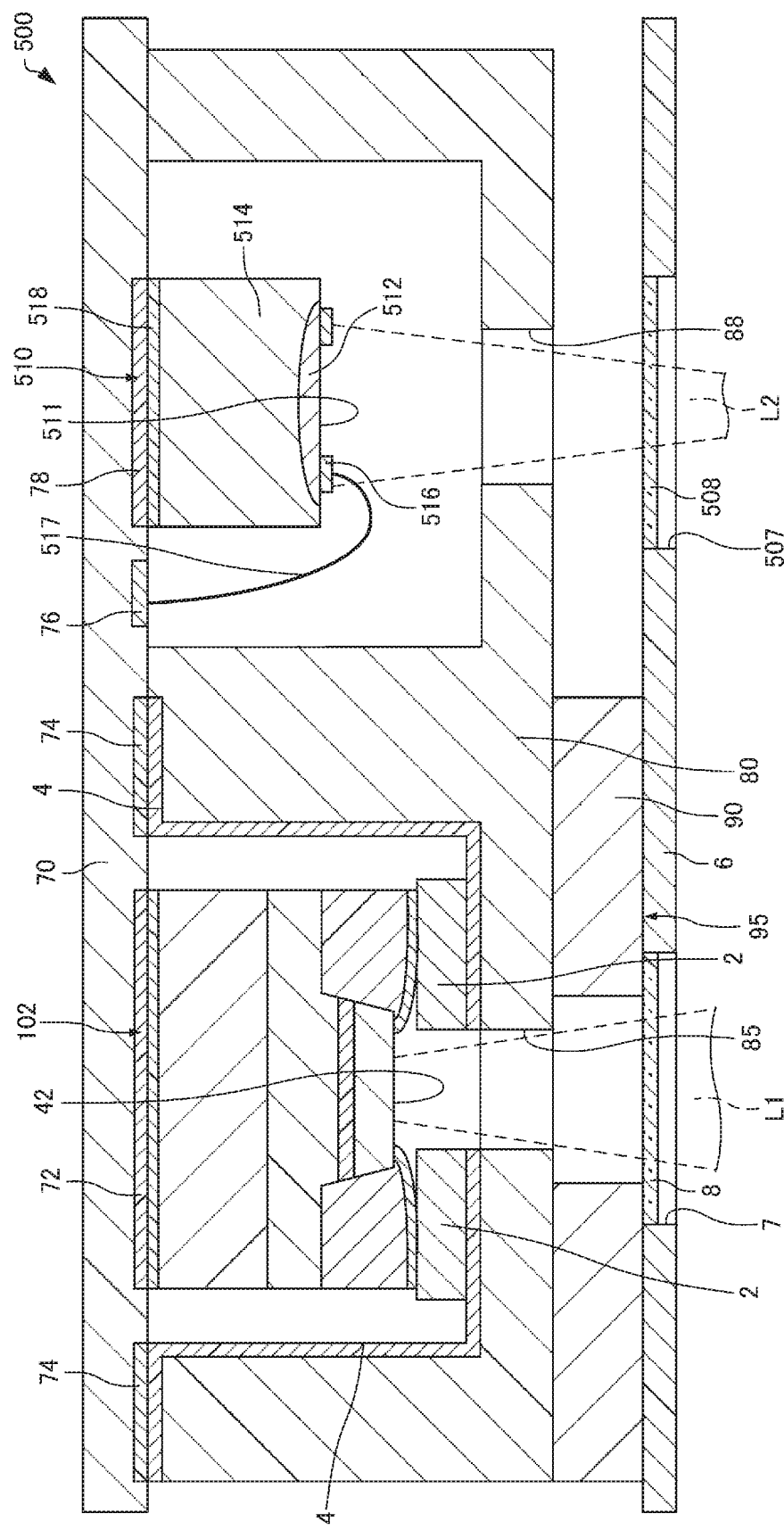
FIG. 13 is a cross-sectional view diagrammatically showing a light emitter according to a fourth variation of the embodiment.

A light emitter according to a fourth variation of the present embodiment will next be described with reference to the drawings. FIG. 13 is a cross-sectional view diagrammatically showing a light emitter 500 according to the fourth variation of the present embodiment.

The light emitter 500 differs from the light emitter 100 described above in that a light receiving device 510 is provided, as shown in FIG. 13.

The light receiving device 510 is mounted on the circuit substrate 70. In the illustrated example, the light receiving device 510 is provided on the −Z-axis-direction side of the circuit substrate 70. The light emitting device 102 and the light receiving device 510 are provided side by side in the X-axis direction.

The light receiving device 510 receives light L2 and detects the light L2. The light L2 is, for example, part of the light L1 scattered in a human body (not shown). The light receiving device 510 is, for example, a photodiode. The light receiving device 510 includes a P-type first semiconductor region 512, an N-type second semiconductor region 514, an anode 516, which is connected to the first semiconductor region 512, and a cathode 518, which is connected to the second semiconductor region 514. The first semiconductor region 512 has a light receiving surface 511, which receives the light L2. The circuit substrate 70 has a third pad 76 and a fourth pad 78. The light receiving device 510 is formed, for example, by using a known method.

The anode 516 is electrically connected to the third pad 76 via a wire 517. The cathode 518 is connected to the fourth pad 78. The pads 76 and 78, the anode 516, the wire 517, and the cathode 518 are each made, for example, of a metal.

The sub-mount 80 is provided with an opening 88. In the illustrated example, the openings 85 and 88 are provided side by side in the X-axis direction. The sub-mount 80 is so shaped as to accommodate the light emitting device 102 and the light receiving device 510. A side section 86 is provided between the light emitting device 102 and the light receiving device 510. The light L2 passes through a light transmitting member 508 and the opening 88 and reaches the light receiving device 510. The light transmitting member 508 is made, for example, of glass. The light transmitting member 508 is provided in an opening 507 of the support member 6. The openings 85 and 88 are formed, for example, in the same manufacturing step.

The cooler 90 (heat conductor 95) is provided between the light exiting surface 42 of the light emitting device 102 and the light receiving surface 511 of the light receiving device 510 when viewed in the layered direction. The cooler 90 is made, for example, of a material that does not transmit the light L1 (material that blocks light L1). The light L1, which is blocked by the cooler 90, is therefore not allowed to directly reach the light receiving surface 511, for example, without passing through the human body.

4. Biological Sensing Apparatus

Figure 14:
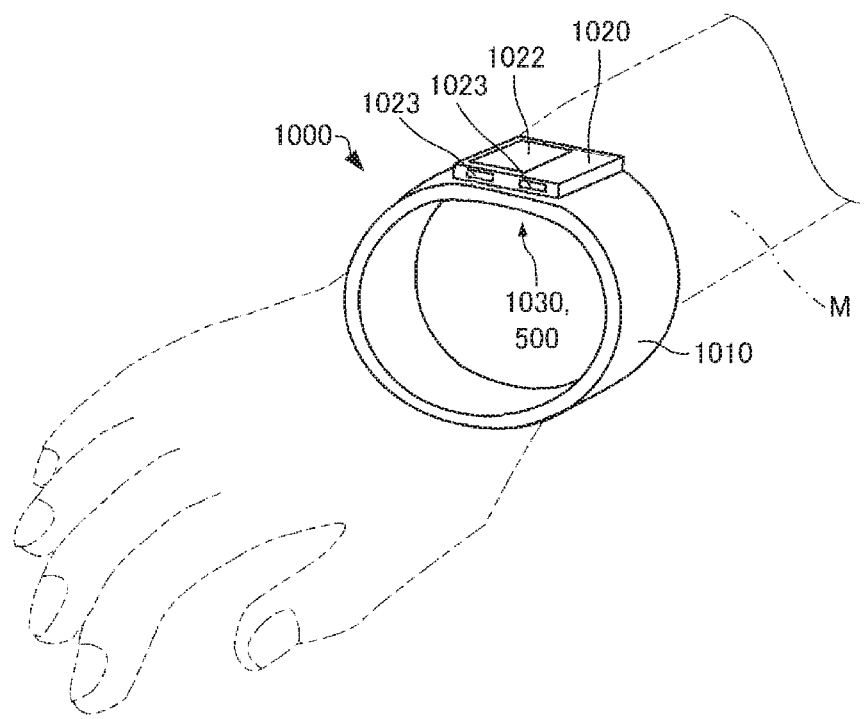
FIG. 14 is a perspective view diagrammatically showing a biological sensing apparatus according to the embodiment.
Figure 15:
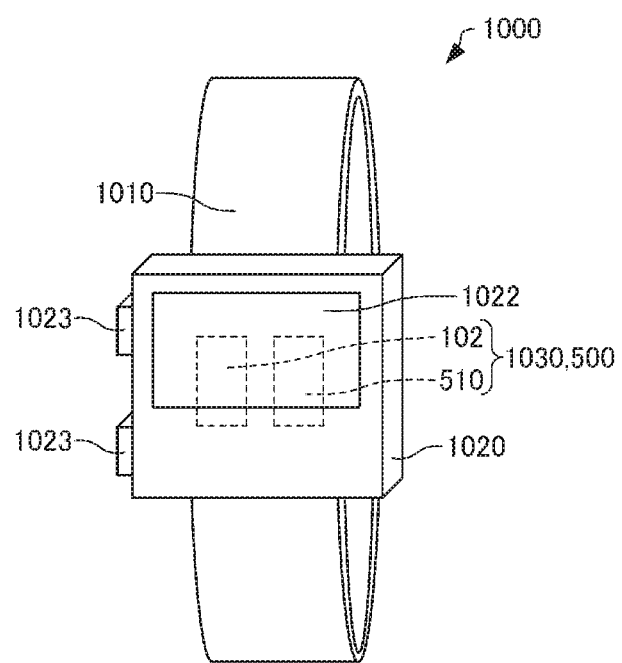
FIG. 15 is a perspective view diagrammatically showing the biological sensing apparatus according to the embodiment.
Figure 16:
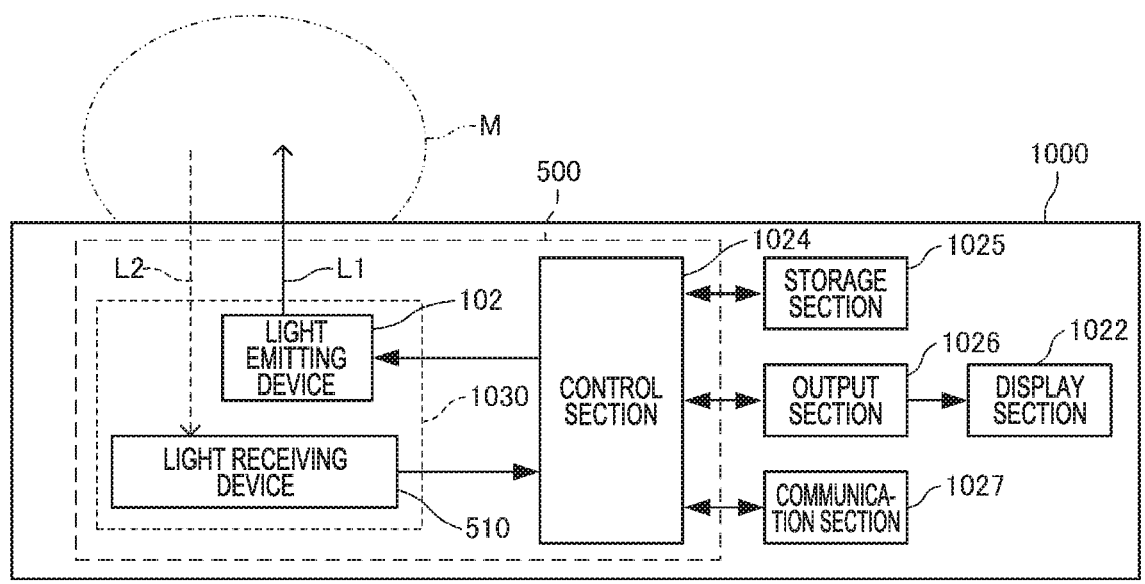
FIG. 16 is a functional block diagram of the biological sensing apparatus according to the embodiment.

A biological sensing apparatus according to the present embodiment will next be described with reference to the drawings. FIGS. 14 and 15 are perspective views diagrammatically showing a biological sensing apparatus 1000 according to the present embodiment. FIG. 16 is a functional block diagram of the biological sensing apparatus 1000 according to the present embodiment.

The biological sensing apparatus according to the embodiment of the invention includes the light emitter according to the embodiment of the invention. The following description will be made of the biological sensing apparatus 1000 including the light emitter 500 described above as the light emitter according to the embodiment of the invention.

The sensing apparatus according to the embodiment of the invention can noninvasively and optically detect the content of a specific component in the blood in a blood vessel, for example, glucose to acquire the blood sugar level, detect a pulsation-induced change in the amount of light absorbed by hemoglobin to acquire the pulse, detect the ratio between contained oxidized hemoglobin and reduced hemoglobin from the difference in the pulsation-induced change in the amount of absorbed light between wavelengths to acquire information relating to saturation of percutaneous oxygen ($SpO_2$). The sensing apparatus according to the embodiment of the invention may detect light scattered by hemoglobin having velocity and therefore Doppler-shifted to acquire the blood flow rate and the pulse.

The following description will be made of the biological sensing apparatus 1000 that detects a pulsation-induced change in the light absorbed by hemoglobin to acquire the pulse. When a blood vessel shrinks, the amount of light absorbed by hemoglobin decreases, whereas when the blood vessel expands, the amount of light absorbed by hemoglobin increases. The biological sensing apparatus 1000 detects a pulsation-induced change in the light absorbed by hemoglobin in the blood to acquire the pulse.

The biological sensing apparatus 1000 is, for example, a portable information terminal worn around a wrist of a human body (living body) M, as shown in FIG. 14. The biological sensing apparatus 1000 includes an annular belt 1010, which can be worn around a wrist, and a main body case 1020, which is attached to the belt 1010, as shown in FIGS. 14 to 15.

The main body case 1020 incorporates a display section 1022 and a sensor section 1030. The display section 1022 is provided in the main body case 1020 and on the side opposite the human body M. The sensor section 1030 is provided in the main body case 1020 and on the side facing the human body M. The sensor section 1030 is so provided, for example, as to be in contact with the human body M. The sensor section 1030 includes the light emitter 500. The main body case 1020 further incorporates operation buttons 1023, a control section 1024 and other circuit systems, a battery as a power source, and other components.

The biological sensing apparatus 1000 includes the display section 1022, the control section 1024, a storage section 1025, an output section 1026, a communication section 1027, and the sensor section 1030 including the light emitter 500, as shown in FIG. 16.

The sensor section 1030 includes the light emitting device 102, which irradiates the human body M with the light L1, and the light receiving device 510, which receives the light L2 from the human body M. The light emitting device 102 and the light receiving device 510 are each electrically connected to the control section 1024. The sensor section 1030 includes, for example, the support member 6 and the light transmitting members 8 and 508.

The control section 1024 drives the light emitting device 102 to cause it to emit the light L1. The light L1 propagates through the human body M and is scattered and absorbed therein. The sensor section 1030 is configured to be capable of receiving part of the light L1 scattered in the human body M in the form of the light L2 with the light receiving device 510.

The control section 1024 can cause the storage section 1025 to store information on the light L2 received with the light receiving device 510. The control section 1024 then causes the output section 1026 to process the information on the light L2. The output section 1026 converts the information on the light L2 into the pulse and outputs the pulse. The control section 1024 can cause the display section 1022 to display the information on the pulse. The biological sensing apparatus 1000 can, for example, send these pieces of information via the communication section 1027 to another information processing apparatus.

The control section 1024 can receive a program and other pieces of information from the other information processing apparatus via the communication section 1027 and cause the storage section 1025 to store the program and other pieces of information. The communication section 1027 may be a wired communicator connected to the other information processing apparatus via a wire or a wireless communicator, for example, with Bluetooth (registered trademark). The control section 1024 may not only cause the display section 1022 to display the information on the pulse but cause the display section 1022 to display the program and other pieces of information stored in the storage section 1025 in advance and the current time and other pieces of information. The storage section 1025 may be a detachable memory.

The function of the display section 1022 can be achieved, for example, by an LCD (liquid crystal display) or an EL display (electroluminescence display). The functions of the control section 1024 and the output section 1026 can be achieved, for example, by a variety of processors (such as CPU (central processing unit) and DSP (digital signal processor)) and other types of hardware or programs. The function of the storage section 1025 can be achieved, for example, by a hard disk drive or a RAM (random access memory). The control section 1024 is, for example, contained in the circuit substrate 70. The storage section 1025, the output section 1026, and the communication section 1027 may be contained in the circuit substrate.

The biological sensing apparatus 1000 has, for example, the following features.

The biological sensing apparatus 1000 includes the light emitter 500. The biological sensing apparatus 1000 can therefore perform efficient cooling.

The biological sensing apparatus 1000 includes the heat conductor 95, which conducts the heat generated in the active layer 30 (heat generated by light emitting device 102) to the support member 6, and the heat conductor 95 connects a side of the light emitting device 102 that is the side facing the second mirror layer 40 to the support member 6. Therefore, in the biological sensing apparatus 1000, the heat conductor 95 is likely to conduct the heat generated by the light emitting device 102 to the support member 6, and the heat generated by the light emitting device 102 can increase the temperature of the surface of the human body M. The thus configured biological sensing apparatus 1000 can prevent the blood vessels in the human body M from shrinking, whereby a large amplitude of the pulse wave can be obtained from the light L2. Therefore, in the biological sensing apparatus 1000, it is unnecessary to increase the amount of current to be injected into the light emitting device 102 in order to produce a large amplitude of the pulse wave, whereby saturation of the amount of radiated light due to an increase in the amount of generated heat. Further, the resultant power saving can reduce the frequency of charging operation. Moreover, since the human body M can be heated with the amount of current maintained, the pulse wave can be recorded in a stabler manner.

As described above, since the heat generated by the light emitting device 102 is conducted to the support member 6, the human body M can be heated. For example, the temperature of the support member 6 may be 38° C. or higher in the state in which the light emitting device 102 is driven.

For example, in a case where the heat conductor 95 connects the substrate 10 of the light emitting device 102 to the support member 6, the heat conductor 95 is unlikely to conduct the heat generated by the light emitting device 102 to the support member 6 because the substrate 10 is thicker than each of the second mirror layer 40 and the semi-insulating member 50. Further, the substrate 10, which is an n-type GaAs substrate, has thermal conductivity lower than that of the i-type semi-insulating member 50. It is conceivable to polish or otherwise process the substrate 10 to reduce the thickness thereof after the light emitting device 102 is mounted on the circuit substrate 70 or the sub-mount 80. In this case, however, it is difficult to reduce the thickness of the substrate 10 to a value comparable to the thickness of the semi-insulating member 50, and the manufacturing steps are also undesirably complicated.

In the illustrated example, the biological sensing apparatus 1000 has been described as a wristwatch-shaped apparatus worn around a wrist of the human body M. The biological sensing apparatus according to the embodiment of the invention may instead be an upper-arm-type apparatus worn around an upper arm, an earlobe-type apparatus worn on an earlobe, or a fingertip-type apparatus worn at a fingertip.

The light emitter according to the embodiment of the invention is not necessarily used in a biological sensing apparatus and may, for example, be used in a product that outputs light to the exterior.

Further, in the case where the light emitting device 102 emits infrared light, the emitted light penetrates the human body M to a deeper position and is scatted by hemoglobin having velocity, and the resultant Doppler-shifted light can be detected.

5. Variation of Biological Sensing Apparatus

Figure 17:
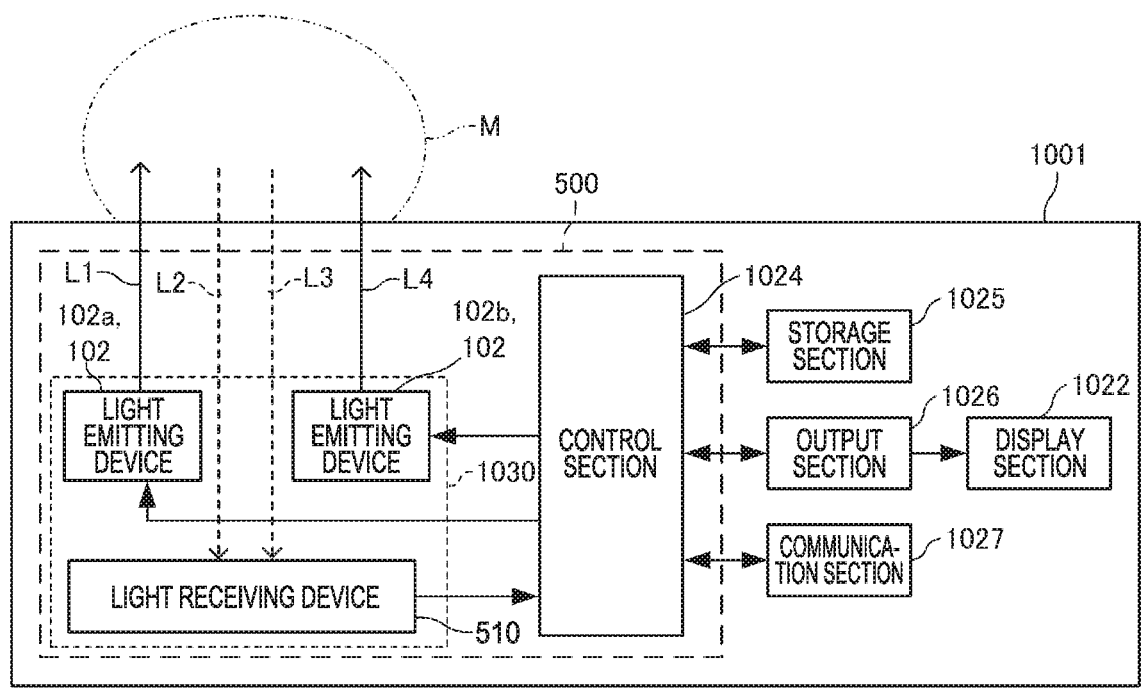
FIG. 17 is a functional block diagram of a biological sensing apparatus according to a variation of the embodiment.

A biological sensing apparatus according to a variation of the present embodiment will next be described with reference to the drawings. FIG. 17 is a functional block diagram of a biological sensing apparatus 1001 according to the variation of the present embodiment.

The description of the biological sensing apparatus 1001 according to the variation of the present embodiment will be made of points different from those of the biological sensing apparatus 1000 according to the present embodiment described above, and the same points will not be described.

The biological sensing apparatus 1000 described above is a biological sensing apparatus that acquires the pulse. In contrast, the biological sensing apparatus 1001 is a biological sensing apparatus that acquires information on $SpO_2$.

The biological sensing apparatus 1001 is provided with two light emitting devices 102 (light emitting device 102a and light emitting device 102b), as shown in FIG. 17. One of the light emitting devices 102 or the light emitting device 102a emits the red light L1, and the other light emitting device 102 or the light emitting device 102b emits infrared light L3. The light receiving device 510 receives part of the light L1 scattered in the human body M in the form of the light L2 and further receives part of the light L3 scattered in the human body M in the form of the light L4. The output section 1026 converts the ratio between the intensity of the light L2 and the intensity of the light L4 into $SpO_2$ and outputs the $SpO_2$. The control section 1024 can cause the display section 1022 to display the information on $SpO_2$.

Regarding the amount of red light absorbed by hemoglobin, the amount of red light absorbed by in-blood oxidized hemoglobin is greater than the amount of red light absorbed by in-blood reduced hemoglobin. On the other hand, the amount of infrared light absorbed by in-blood reduced hemoglobin is greater than the amount of infrared light absorbed by in-blood oxidized hemoglobin. The biological sensing apparatus 1001 can therefore calculate $SpO_2$, which is the proportion of the oxidized hemoglobin in the artery, from the ratio between a pulsation-induced change in the absorbed light L2 and a pulsation-induced change in the absorbed light L4.

In the invention, part of the configuration thereof may be omitted and the embodiment and variations may be combined with each other to the extent that the features and effects described in the present application are provided.

The present invention encompasses substantially the same configuration as the configuration described in the embodiment (for example, a configuration having the same function, using the same method, and providing the same result or a configuration having the same purpose and providing the same effect). Further, the present invention encompasses a configuration in which an inessential portion of the configuration described in the embodiment is replaced. Moreover, the present invention encompasses a configuration that provides the same advantageous effects as those provided by the configuration described in the embodiment or a configuration that can achieve the same purpose as that achieved by the configuration described in the embodiment. Further, the present invention encompasses a configuration in which a known technology is added to the configuration described in the embodiment.

The entire disclosure of Japanese Patent Application No. 2018-013739, filed Jan. 30, 2018 is expressly incorporated by reference herein.

What is claimed is:

1. A light emitter comprising:
   a substrate;
   a first mirror layer provided on the substrate, the first mirror layer having a center area and first and second side areas, the first and second areas extending along two sides of the first mirror layer in a plan view;
   an active layer provided or on the center area of the first mirror layer;
   a second mirror layer provided only on the active layer;
   a semi-insulating member provided only on the first and second side areas of the first mirror layer, the semi-insulating member having thermal conductivity higher than thermal conductivity of the first mirror layer and thermal conductivity of the second mirror layer, the semi-insulating member sandwiching a first stacked structure of the active layer and the second mirror layer in a cross-sectional view perpendicular to the plan view; and
   a sub-mount that is U-shaped, the sub-mount having a first wall, a second wall, and a bottom continuously extending from the first and second walls, an opening, through which a light from the active layer passes, being provided in the bottom,
   wherein a second stacked structure of the substrate, the first mirror layer, the active layer, the second mirror layer, and the semi-insulating layer is quadrangular prism-shaped and has first and second side surfaces,
   the first and second walls of the sub-mount extend along the first and second side surfaces of the second stacked structure, respectively, and
   the semi-insulating member is bonded to the bottom of the sub-mount.

2. The light emitter according to claim 1,
   further comprising a Peltier device or a heat sink provided on the bottom of the sub-mount.

3. The light emitter according to claim 1,
   wherein the sub-mount is made of silicon, and
   the light produced in the active layer has a wavelength of 940 nm or longer.

4. The light emitter according to claim 1,
   wherein a distance between inner surfaces of the opening in the cross-sectional view increases an external side along a light passing direction.

5. The light emitter according to claim 1,
   wherein the semi-insulating member is made of gallium arsenide.

6. The light emitter according to claim 1,
   further comprising a circuit substrate that is provided on a side of the substrate that is opposite to the first mirror layer and drives a light emitting device including the first mirror layer, the active layer, and the second mirror layer.

7. The light emitter according to claim 6,
wherein ends of the first and second walls of the submount are bonded to the circuit substrate via a bonding member, and
the bonding member includes
a protrusion made of a resin, and
an electrically conductive layer that covers the protrusion.

* * * * *